United States Patent [19]  
Wada et al.

[11] Patent Number: 5,068,866  
[45] Date of Patent: Nov. 26, 1991

[54] SEMICONDUCTOR LASER APPARATUS

[75] Inventors: Masaru Wada, Akaiwa; Kunio Itoh, Uji, both of Japan

[73] Assignee: Matsushita Electric Industrial Co., Ltd., Osaka, Japan

[21] Appl. No.: 428,517

[22] Filed: Oct. 30, 1989

[30] Foreign Application Priority Data

Oct. 28, 1988 [JP] Japan .................. 63-274148
Oct. 28, 1988 [JP] Japan .................. 63-274149

[51] Int. Cl.⁵ .................... H01S 3/025; H01L 23/28
[52] U.S. Cl. .............................. 372/36; 372/49; 357/72
[58] Field of Search .............. 372/36, 43, 44, 49; 357/72, 19, 17; 350/96.20, 96.27

[56] References Cited

U.S. PATENT DOCUMENTS

| | | | |
|---|---|---|---|
| 4,092,659 | 5/1978 | Ettenburg | 357/18 |
| 4,510,607 | 4/1985 | Garcia et al. | 372/49 |
| 4,745,294 | 5/1988 | Kobashi et al. | 250/551 |
| 4,768,070 | 8/1988 | Takizawa et al. | 357/17 |
| 4,780,752 | 10/1988 | Angerstein et al. | 357/72 |
| 4,797,895 | 1/1989 | Kokubo et al. | 372/43 |
| 4,877,756 | 10/1989 | Yamamoto et al. | 437/209 |
| 4,914,668 | 4/1990 | Nagai et al. | 372/49 |
| 4,929,965 | 5/1990 | Fuse | 346/107 R |

FOREIGN PATENT DOCUMENTS

3810899A1 10/1988 Fed. Rep. of Germany .

OTHER PUBLICATIONS

Patent Abstracts of Japan, vol. 9, No. 197, JP-A-60 063 977 (Mitsubishi Denki K.K., p. 197, Aug. 14, 1985.
Patent Abstracts of Japan, vol. 11, No. 219, JP-A-62 036 614 (Matsushita Electric Ind. Co., Ltd.), p. 219, Jul. 16, 1987.
Patent Abstracts of Japan, vol. 9, No. 53, JP-A-59 193 080 (Hitachi Seisakusho K.K.), Mar. 7, 1985.
Journal of Lightwave Technology, vol. LT-5, No. 9, Sep. 1987, pp. 1263–1268, New York, US; Y. Nakajima et al., "High-Power High-Reliability Operation of 1.3-mum p-substrate Buried Crescent Laser Diodes".

Primary Examiner—William L. Sikes
Assistant Examiner—Galen J. Hansen
Attorney, Agent, or Firm—Wenderoth, Lind & Ponack

[57] ABSTRACT

A laser chip is directly disposed on a support member through a mounting arrangement and a support member, the laser chip, and peripheral parts thereof are integrally sealed within a transparent plastic resin. In this structure, without requiring expensive materials and parts, a semiconductor laser apparatus may be manufactured by using the same materials and process as in the ordinary plastic-sealed LED, so that the cost may be reduced significantly.

6 Claims, 7 Drawing Sheets

SEMICONDUCTOR LASER APPARATUS

BACKGROUND OF THE INVENTION

This invention relates to a semiconductor laser apparatus usable as a light source of an optical information processing apparatus or an optical communications apparatus.

The semiconductor laser apparatus has recently been used widely as the light source for an optical information processing apparatus such as compact disc devices and video disc or optical communications apparatus.

Such semiconductor laser apparatus cannot be easily reduced in cost, as compared with LED or other semiconductor devices.

The difficulty of reducing the cost of semiconductor laser apparatus, as compared with LED and other semiconductor devices, is due to not only the problem of yield, but also the expensive materials and components.

Figure 11:
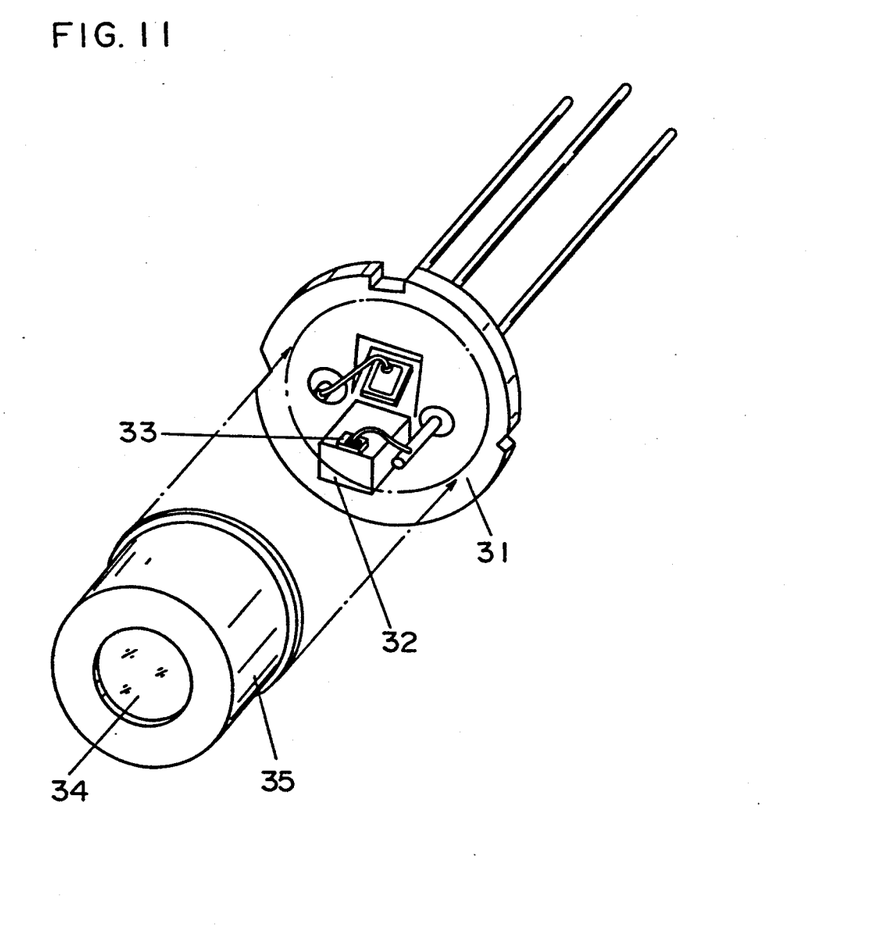
FIG. 11 is a perspective view of a conventional semiconductor laser apparatus.

The conventional semiconductor laser apparatus is of the can type as shown in FIG. 11, in which a silicon submount 32 and a laser chip 33 are disposed on a gold-plated stem 31 of about 1 μm in thickness, and its surface is further covered with a cap 35 having a window glass 34 coated with an anti-reflection (AR) film. This cap 35 is filled with $N_2$ gas.

In such conventional semiconductor laser apparatus, since parts other than the laser chip 33, such as stem 31 and cap 35, are expensive, cost reduction is limited, and further, structurally, since the semiconductor laser apparatus has a wide-spread radiated beam, a lens system for correcting the beam is necessary, and the entire optical pickup device for composing the optical system becomes expensive.

SUMMARY OF THE INVENTION

It is hence a first object of the invention to present a semiconductor laser apparatus which may be manufactured at a low cost, without using expensive parts, by using the same materials and same process as in the ordinary plastic-sealed type LED.

It is a second object of the invention to present a semiconductor laser apparatus easy in the control of reflectivity of laser beam, without being influenced by $N_2$ gas.

It is a third object of the invention to present a semiconductor laser apparatus low in reflectivity and high in output.

The semiconductor laser apparatus of the invention is, in short, designed to dispose a laser chip having the cavity end surface coated with high reflectivity film on a support number through a mount member, and cover the entire surface of the laser chip, the support member and the mount member with a transparent plastic resin.

In this constitution, since the laser chip is disposed on the support member by way of the mount member, it does not require expensive parts used in the prior art, such as Au-plated stem and cap with AR-coated window glass, and it can be composed by using the same materials and process as in the ordinary plastic-sealed type LED. Furthermore, since the outline of the plastic resin may be shaped in a lens form or a slope type, the parallelism or astigmatism of the radiated beam may be corrected without using a lens system for correction.

BRIEF DESCRIPTION OF THE DRAWINGS

FIGS. 5 (a), 5 (b), and 5 (c) are perspective views for explaining the method of manufacturing the semiconductor laser apparatus of FIG. 1;

DETAILED DESCRIPTION OF THE INVENTION

The first embodiment of the invention is described below while referring to the drawings.

Figure 1:
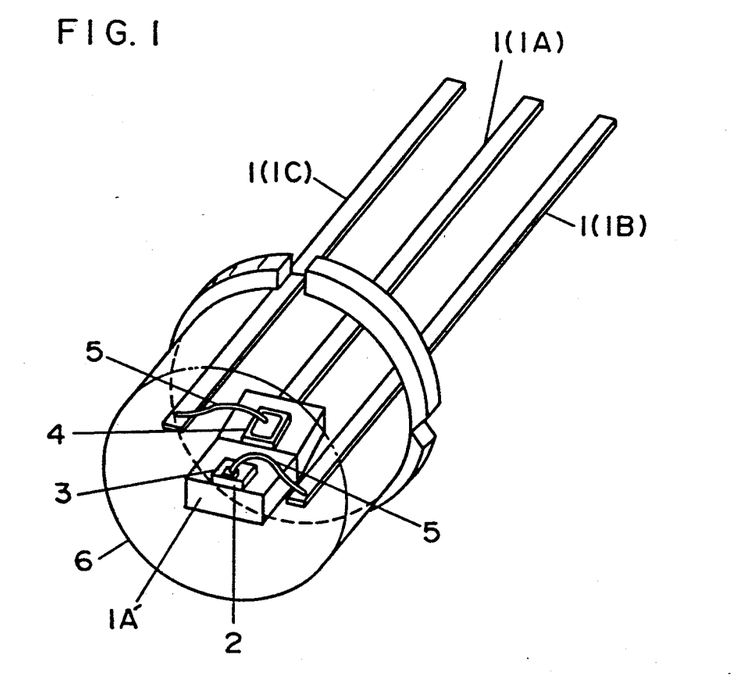
FIG. 1 is a perspective view of a semiconductor laser apparatus in accordance with a first embodiment of the present invention.
Figure 2:
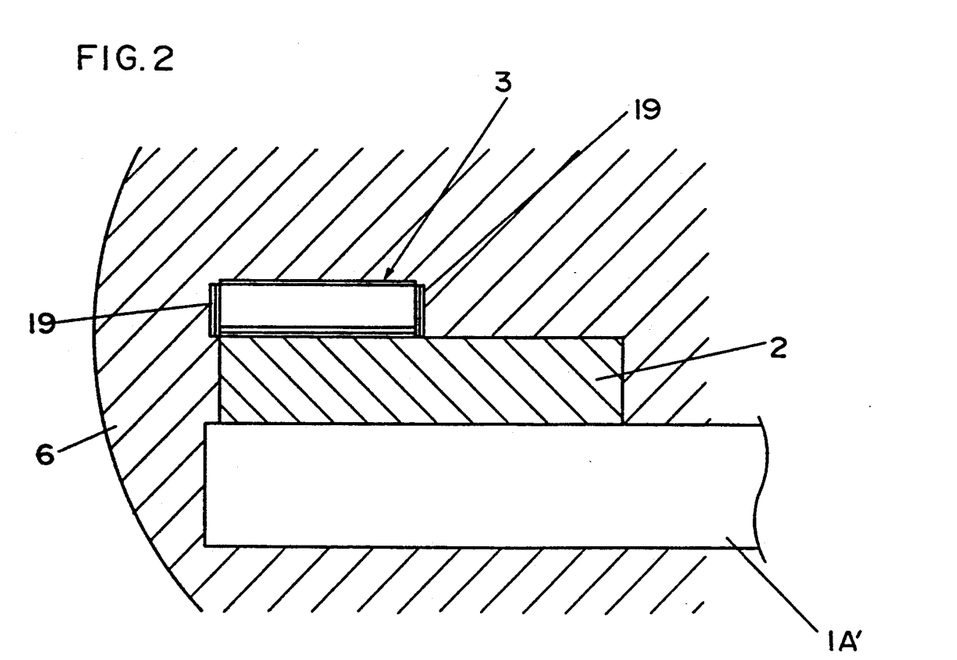
FIG. 2 is an essential sectional view of the semiconductor laser apparatus of FIG. 1.

Referring first to FIG. 1 and FIG. 2, the structure of the semiconductor laser apparatus is explained.

In FIG. 1, and FIG. 2, of the three metal leads 1(1A), 1(1B), and 1(1C) shown, of the middle lead 1A is attached to a broad mount part 1A'. Near the front tip of the upper surface of the mount part 1A', a silicon submount 2 is fitted, and a laser chip 3 is disposed on the surface of this silicon submount 2. Behind the upper surface of the mount part 1A', a photodiode chip 4 is disposed in order in receive the beam radiated from the laser chip 3 to the backward direction. The laser chip 3 and photodiode chip 4, and leads 1B, 1C adjacent the middle lead 1A are respectively electrically connected through metal wires 5. Laser chip 3, diode chip 4, silicon submount 2, mount part 1A', and the same end portions of the chips 3 and 4 of three leads 1A to 1C are covered with a transparent plastic resin 6 such as a epoxy resin. Therefore, the outer circumference of the chips 3 and 4 is in contact with the plastic resin 6.

The manufacturing method of this semiconductor laser apparatus is explained below while referring to FIG. 3 and FIG. 4. As the laser chip 3, meanwhile, the electrode stripe type as one of the basic structures is explained as an example.

Figure 3:
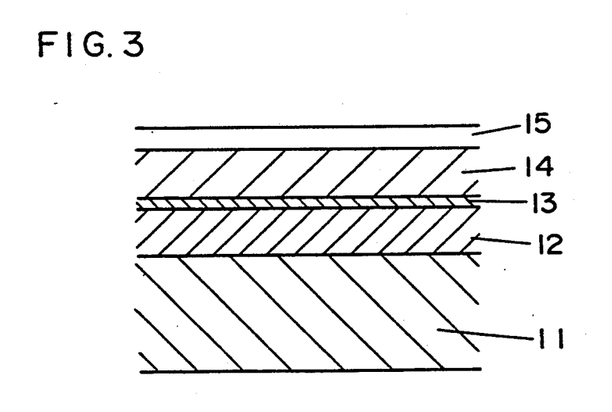
FIG. 3 and FIG. 4 are a sectional view and a perspective view showing the laser chip in the semiconductor laser apparatus of FIG. 1.
Figure 4:
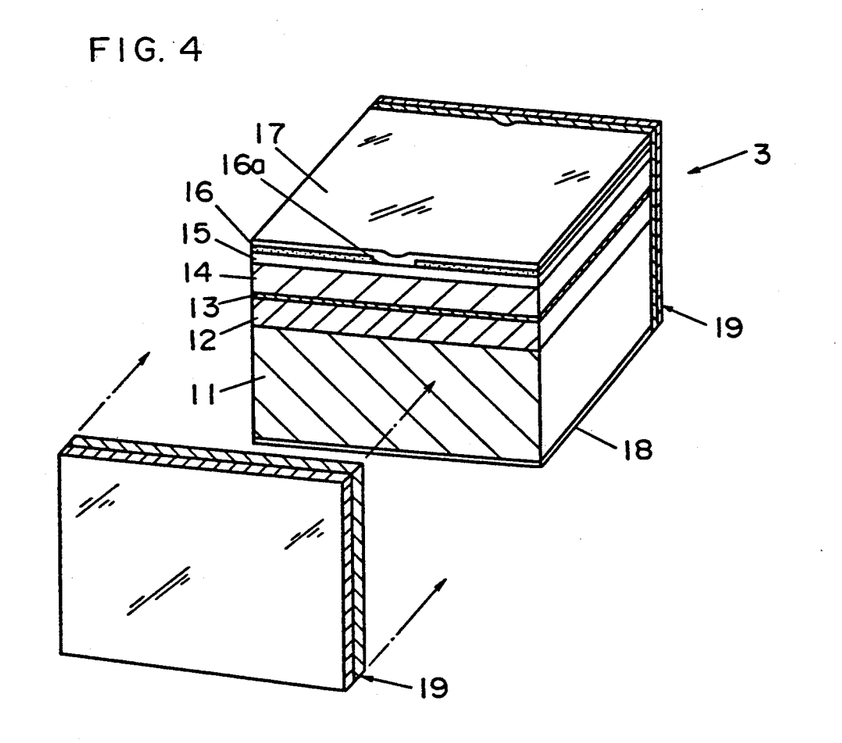

First, as shown in FIG. 3, on an n-type GaAs(100) substrate 11, an n-type $Ga_{0.6}Al_{0.4}As$ cladding layer 12, a GaAs active layer 13, a p-type $Ga_{0.6}Al_{0.4}As$ cladding layer 14, and a p-type GaAs cap layer 15 are sequentially grown epitaxially. Next, as shown in FIG. 4, on the surface of the cap layer 15 an, $Al_2O_3$ film 16 is formed, and a striped window 16a of 5 μm in width is formed in a direction parallel to the (011) direction. Afterwards, a p-type electrode 17 is formed on the upper surface of the wafer, and an n-type electrode 18 on the lower surface thereof. A high reflectivity film 19 made of dielectric multilayer film or metal such as aluminum is formed at both ends of the cavity surface formed by cleaving this wafer, thereby obtaining a laser chip 3.

Figure 5:
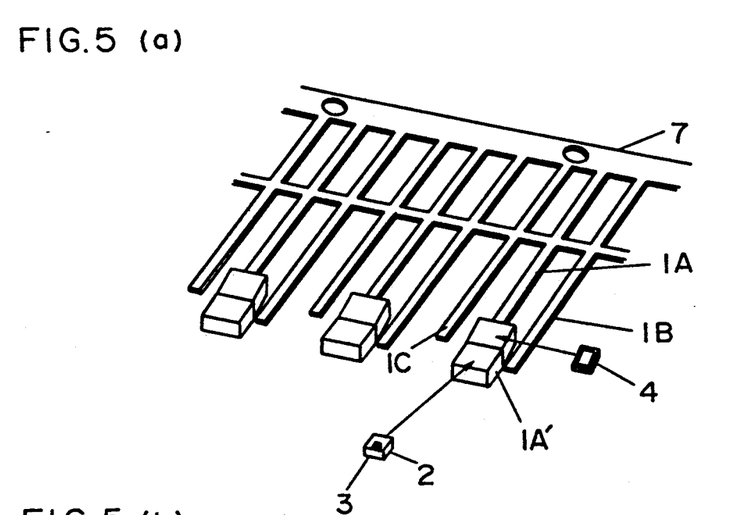

In consequence, as shown in FIG. 5 (a), this laser chip 3 is bonded, together with the photodiode chip 4, on the lead frame 7 by way of the silicon submount 2, that is, on the mount part 1A' provided at the front end of the middle lead 1A. Next, as shown in FIG. 5 (b), the laser chip 3 and lead 1B, the photodiode chip 4 and lead 1C are wire bonded with metal wires 5 respectively. Subsequently, as shown in FIG. 5 (c), all parts at the front end of the leads 1A, 1B, 1C are covered with the transparent plastic resin 6 to seal them airtightly. Finally, the rear ends of the leads 1A to 1C of the lead frame 7 are cut off, then an individual semiconductor laser apparatus 8 is obtained as shown in FIG. 5 (c).

Thus, according to the semiconductor laser apparatus of this embodiment, without requiring expensive parts as in the prior art, such as an Au-plated stem and cap with AR-coated window glass, the semiconductor laser apparatus can be manufactured by employing the same materials and process as in an ordinary plastic-sealed LED, so that the cost may be reduced greatly.

Figure 6:
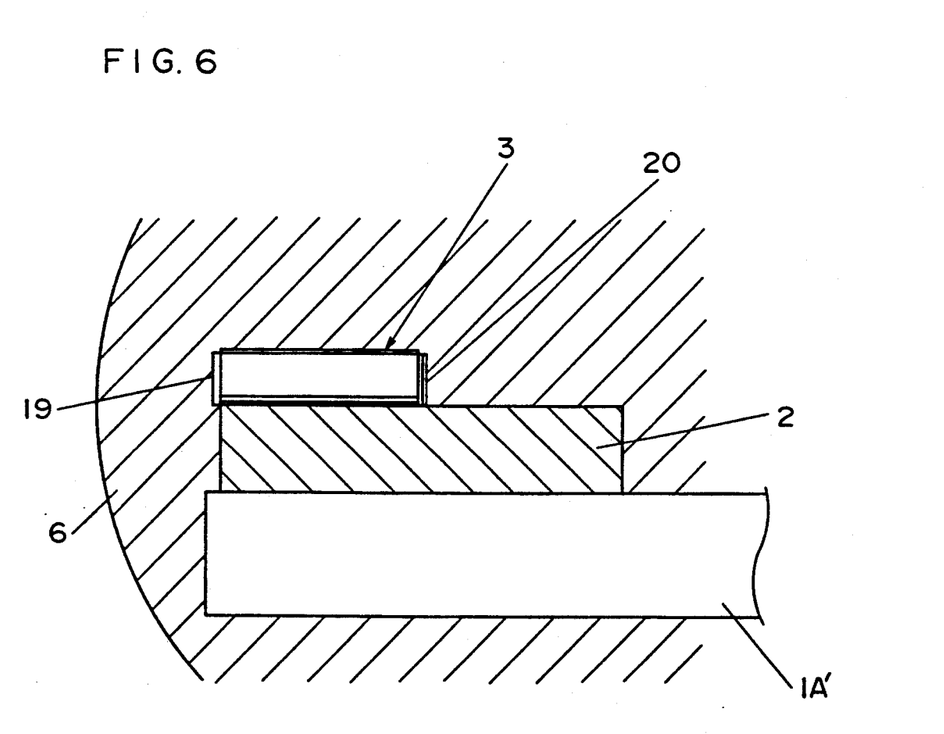
FIG. 6 is an essential sectional view of a semiconductor laser apparatus in accordance with a second embodiment of the present invention.
Figure 7:
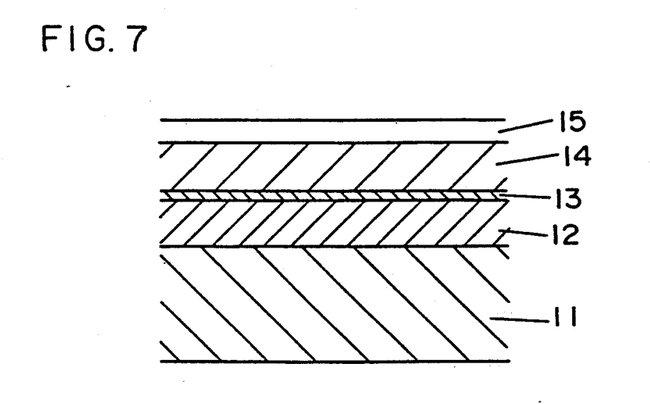
FIG. 7 and FIG. 8 are a sectional view and a perspective view showing the laser chip in the semiconductor laser apparatus of FIG. 6.
Figure 8:
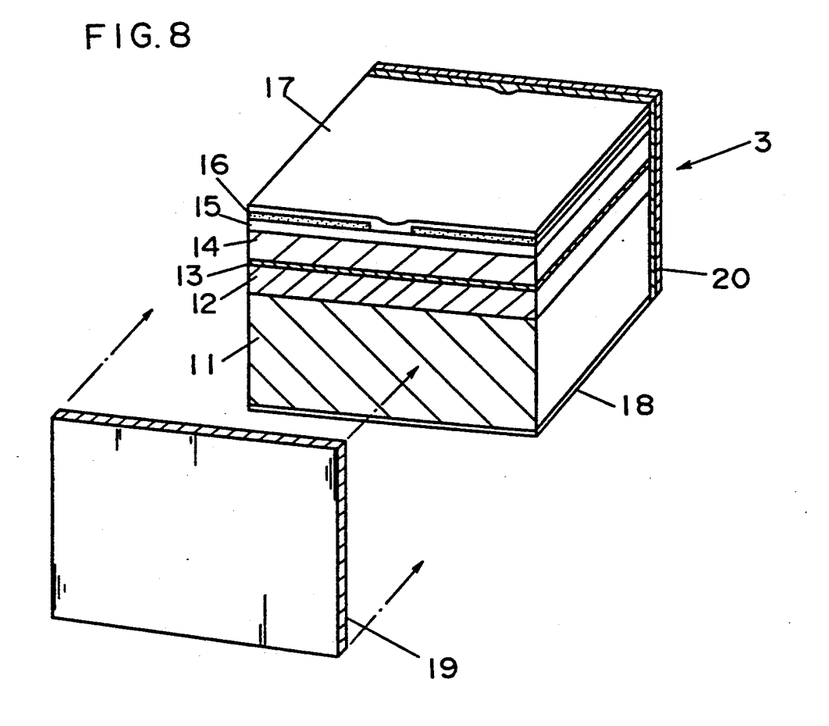

The second embodiment of the invention is explained while referring to FIG. 6 to FIG. 8.

In the second embodiment, as shown in FIG. 6, the front end surface of the cavity of the laser chip 3 is covered with a dielectric monolayer film 19, while the rear end surface of the cavity is covered with a dielectric multilayer film 20.

The manufacturing method of this semiconductor laser apparatus is explained on the basis of FIG. 7 and FIG. 8. As an example of the laser chip 3, the electrode stripe type which is known as one of the basic structures is explained herein.

First, as shown in FIG. 7, on an n-type GaAs(100) substrate 11, an n-type $Ga_{0.6}Al_{0.4}As$ cladding layer 12, an undoped GaAs active layer 13, a p-type $Ga_{0.6}Al_{0.4}As$ cladding layer 14, and a p-type GaAs cap layer 15 are sequentially grown epitaxially. Next, as shown in FIG. 8, an $Al_2O_3$ film 16 is formed on the surface of the cap layer 15, and a striped window 16a of 5 μm in width is formed in a direction parallel to the (011) direction. Afterwards, a p-type electrode 17 is formed on the upper surface of the wafer, and an n-type electrode 18 on the lower surface thereof. On the front end surface of the cavity formed by cleaving this wafer, a dielectric monolayer film 19 with a thickness of a λ/2 n (a: constant, λ: oscillation wavelength, n: refractive index) is formed, while a dielectric multilayer film 20 is formed on the rear end surface of the cavity, thereby obtaining a laser chip 3.

This single laser chip 3 is bonded to the silicon submount 2, with the epitaxial surface side down, or upside down. The subsequent processes are same as in the first embodiment. That is, as shown in FIG. 5 (a), on the lead frame 7, that is, on the mount part 1A' disposed at the front end of the middle lead 1A the laser chip 3 is bonded together with the photodiode chip 4. Next, as shown in FIG. 5 (b), the laser chip 3, photodiode chip 4, and the leads 1B and 1C are bonded together with metal wire 5 respectively. Next, as shown in FIG. 5 (c), all parts at the front ends of the leads 1A, 1B, 1C are tightly covered with transparent plastic resin 6. Finally, the rear ends of the leads 1A to 1C of the lead frame 7 are cut off, so that an individual semiconductor laser apparatus 8 is obtained as shown in FIG. 5 (c).

Thus, according to the semiconductor laser apparatus of the second embodiment of the invention, without requiring expensive parts as used in the prior art such as an Au-plated stem and a cap with an AR-coated window glass, the same materials and process as in the ordinary plastic-sealed LED may be employed, so that the cost may be significantly curtailed. Moreover, since the low reflectivity side of the laser chip 3 is directly covered with plastic resin, there is no influence of $N_2$ gas on the reflectivity as compared with the sealing with $N_2$ gas as in the prior art, and control of reflectivity of laser beam becomes easy.

Figure 9:
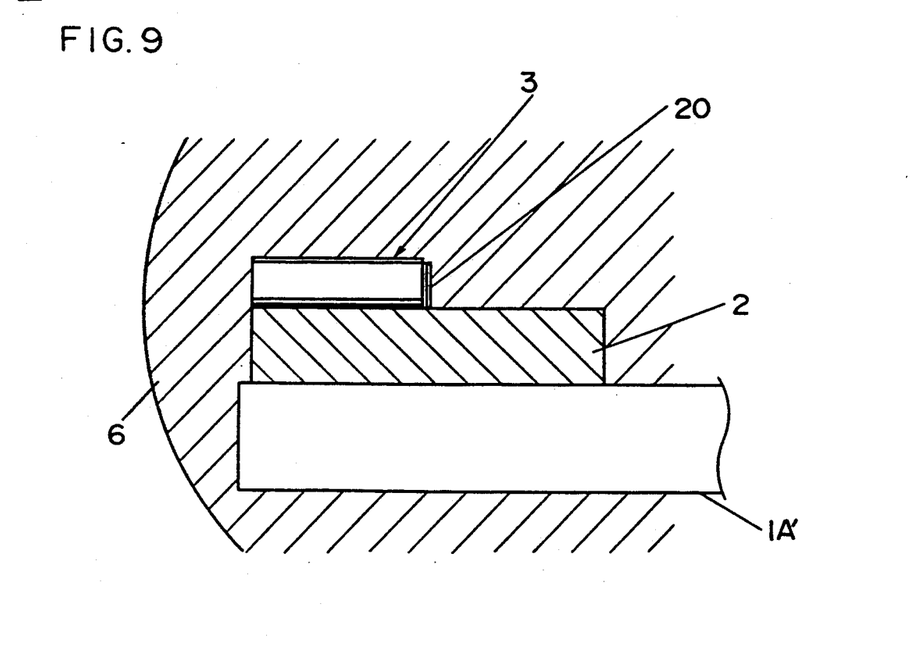
FIG. 9 is an essential sectional view of a semiconductor laser apparatus in accordance with a third embodiment of the present invention.
Figure 10:
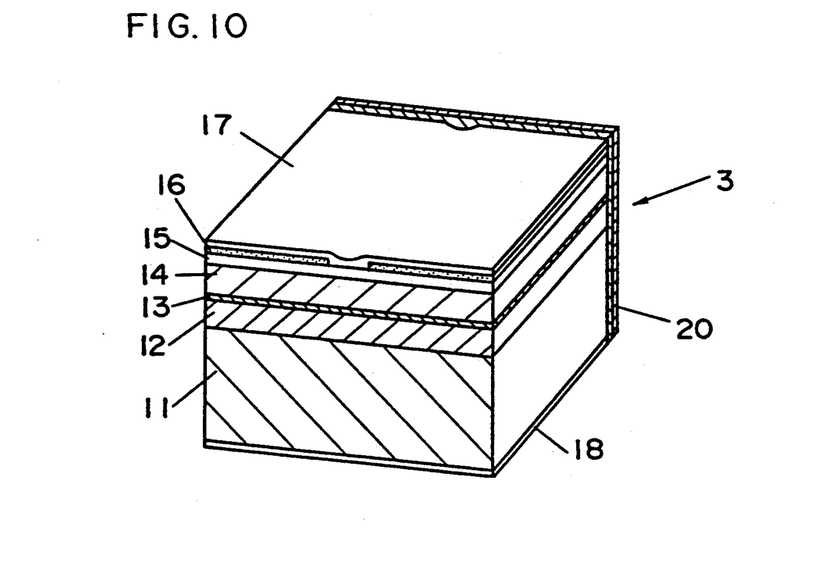
FIG. 10 is a sectional view and a perspective view showing the laser chip in the semiconductor laser apparatus of FIG. 9.

The third embodiment of the present invention is described below while referring to FIG. 9 and FIG. 10.

The third embodiment is similar to the second embodiment, except that the dielectric monolayer film 19 formed on the front end surface of the cavity is eliminated, while a high reflectivity film 20 made of dielectric multilayer film or metal such as aluminum is formed on the rear end surface of the cavity. Therefore, the state after assembling is same as in the first and second embodiments, and as shown in FIG. 5 (c), the laser chip 3 and its peripheral parts are covered with plastic resin 6 with the refractive index of, for example, 1.54.

According to the constitution of the third embodiment, since the refractive index of the sealing plastic resin 6 is 1.54, the reflectivity can be lowered only by adhering the plastic resin 6 to the front end surface directly, without fitting the dielectric monolayer film with thickness of λ2 n to the front end face, so that the process may be simplified. Hence, a high output semiconductor laser apparatus at low cost may be realized.

Incidentally, in the first, second and third embodiments alike, since the outline of the plastic resin 6 may be shaped in a lens form or slope type, parallelism or astigmatism of the radiated beam may be corrected without using a lens system for correction, so that the cost may be reduced greatly on the whole.

Thus, according to this invention, since the laser chip is directly mounted on a support member such as a metal lead through a mount member such as a silicon submount, expensive parts used in the prior art such as an Au-plated stem and a cap with an AR-coated window glass are not required, and the semiconductor laser apparatus may be fabricated by using the same materials and process as in the ordinary plastic-sealed LED. Still more, since the film at the low reflectivity side of the laser chip is directly covered with plastic resin, there is no effect of $N_2$ gas on the reflectivity as compared with the conventional sealing with $N_2$ gas, so that the reflectivity of the laser beam may be controlled easily. Furthermore, if film is not formed at the low reflectivity side of the laser chip, the reflectivity can be lowered only by the refractive index of the sealing plastic resin, and therefore the manufacturing process can be simplified, so that a semiconductor laser apparatus of high output may be realized at low cost.

We claim:
1. A semiconductor laser apparatus comprising:
   a laser chip having a high reflectivity film formed on at least one end surface of a cavity thereof;
   a photodiode chip;
   a support member for supporting said laser chip through a mount member and for supporting said diode chip so as to receive a laser beam radiated from said laser chip in a backward direction, said support member being an end portion of a metal lead;

a transparent plastic resin for encapsulating said laser chip, said support member, said mount member and said photodiode chip.

2. A semiconductor laser apparatus according to claim 1, wherein said high reflectivity film is made of a dielectric film or a metal film.

3. A semiconductor laser apparatus according to claim 1, wherein said high reflectivity film is formed on both end surfaces of said cavity.

4. A semiconductor laser apparatus according to claim 1, wherein said high reflectivity film is formed on both end surfaces of said cavity, and one high reflectivity film is made of a dielectric monolayer film and the other high reflectivity film is made of a dielectric multilayer film or a metal film.

5. A semiconductor laser apparatus according to claim 1, wherein said high reflectivity film is formed only at one end surface of said cavity.

6. A semiconductor laser apparatus according to claim 1, wherein the refractive index of said plastic resin is 1.54.

* * * * *